(12) United States Patent
Kim et al.

(10) Patent No.: US 10,957,534 B2
(45) Date of Patent: Mar. 23, 2021

(54) MANUFACTURING METHOD OF SEMICONDUCTOR DEVICE

(71) Applicant: SK hynix Inc., Icheon (KR)

(72) Inventors: Sun Young Kim, Andong (KR); Nam Jae Lee, Cheongju (KR)

(73) Assignee: SK hynix Inc., Icheon (KR)

( * ) Notice: Subject to any disclaimer, the term of this patent is extended or adjusted under 35 U.S.C. 154(b) by 25 days.

(21) Appl. No.: 16/657,649

(22) Filed: Oct. 18, 2019

(65) Prior Publication Data
US 2020/0350168 A1 Nov. 5, 2020

(30) Foreign Application Priority Data

Apr. 30, 2019 (KR) .................. 10-2019-0050639

(51) Int. Cl.
*H01L 21/02* (2006.01)
*H01L 21/82* (2006.01)
*H01L 27/06* (2006.01)

(52) U.S. Cl.
CPC .... *H01L 21/02595* (2013.01); *H01L 21/0254* (2013.01); *H01L 21/02178* (2013.01); *H01L 21/02532* (2013.01); *H01L 21/02554* (2013.01); *H01L 21/82* (2013.01); *H01L 27/0688* (2013.01)

(58) Field of Classification Search
CPC ........... H01L 21/02595; H01L 27/0688; H01L 21/82; H01L 21/02532; H01L 21/0254; H01L 21/02554; H01L 21/02178; H01L 27/11582
USPC ........................................................ 438/109
See application file for complete search history.

(56) References Cited

U.S. PATENT DOCUMENTS

| 2007/0252201 A1* | 11/2007 | Kito ................. H01L 27/11573 257/331 |
| 2010/0123184 A1* | 5/2010 | Izumida ............ H01L 27/11582 257/326 |
| 2010/0193964 A1* | 8/2010 | Farooq ................... H01L 25/50 257/774 |
| 2010/0207195 A1* | 8/2010 | Fukuzumi ......... H01L 27/11578 257/326 |
| 2011/0309431 A1* | 12/2011 | Kidoh ............... H01L 27/11575 257/324 |
| 2012/0161310 A1* | 6/2012 | Brindle ............. H01L 21/02532 257/734 |

(Continued)

FOREIGN PATENT DOCUMENTS

| KR | 20160025842 A | 3/2016 |
| KR | 20180042358 A | 4/2018 |

*Primary Examiner* — Sheikh Maruf

(57) ABSTRACT

A method of manufacturing a semiconductor device includes forming a first sacrificial layer including a nitride over a first source layer, forming a second sacrificial layer including aluminum oxide over the first sacrificial layer, forming a second source layer over the second sacrificial layer, forming a stacked structure over the second source layer, forming a channel layer that passes through the stacked structure, the second source layer, the second sacrificial layer, and the first sacrificial layer, the channel layer being enclosed by a memory layer, forming a slit that passes through the stacked structure and the second source layer, forming a polysilicon spacer in the slit, forming an opening by removing the first sacrificial layer and the second sacrificial layer, exposing the channel layer by etching the memory layer, and forming a third source layer in the opening.

20 Claims, 16 Drawing Sheets

(56) References Cited

U.S. PATENT DOCUMENTS

| | | | |
|---|---|---|---|
| 2015/0179505 A1* | 6/2015 | Stuber | B81C 1/00698 257/506 |
| 2015/0243643 A1* | 8/2015 | Li | H01L 23/5226 438/109 |
| 2015/0294958 A1* | 10/2015 | Mallik | H01L 23/3114 438/109 |
| 2015/0357240 A1* | 12/2015 | Law | H01L 23/5286 438/109 |
| 2016/0013174 A1* | 1/2016 | Han | H01L 21/561 438/109 |
| 2016/0284712 A1* | 9/2016 | Liaw | H01L 29/665 |
| 2017/0263620 A1* | 9/2017 | Lee | H01L 27/11565 |

* cited by examiner

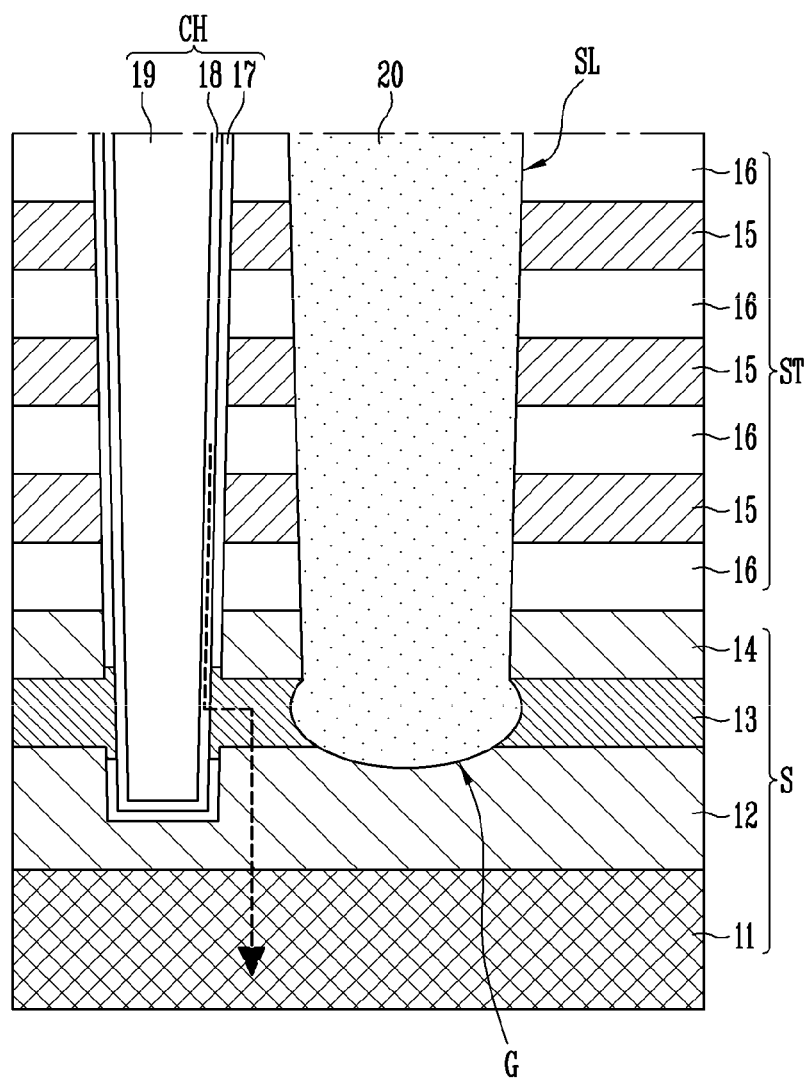

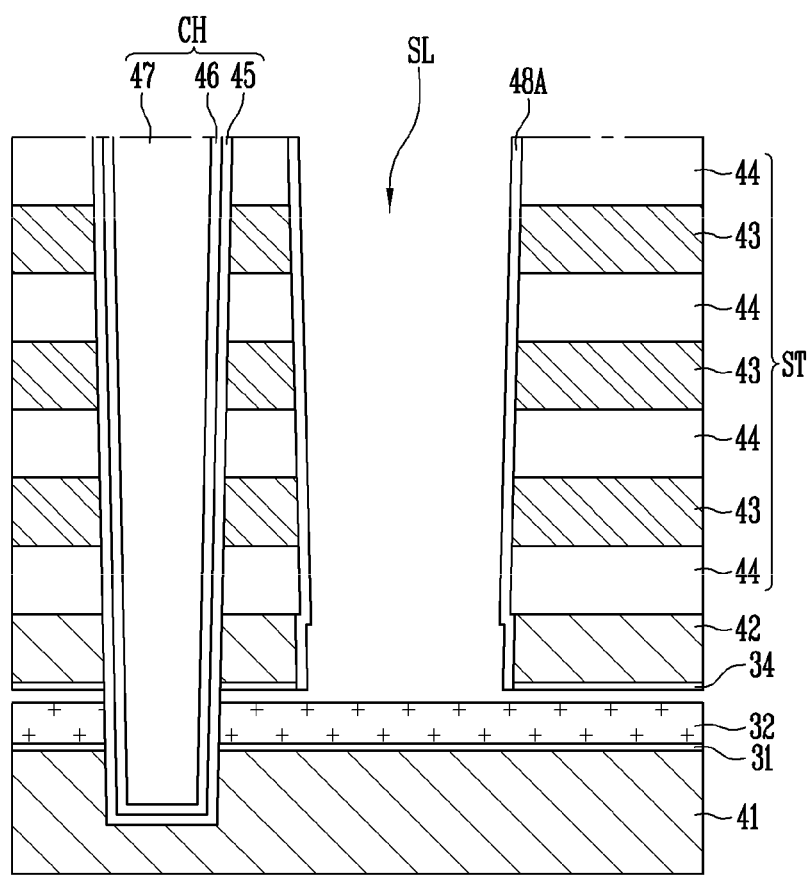

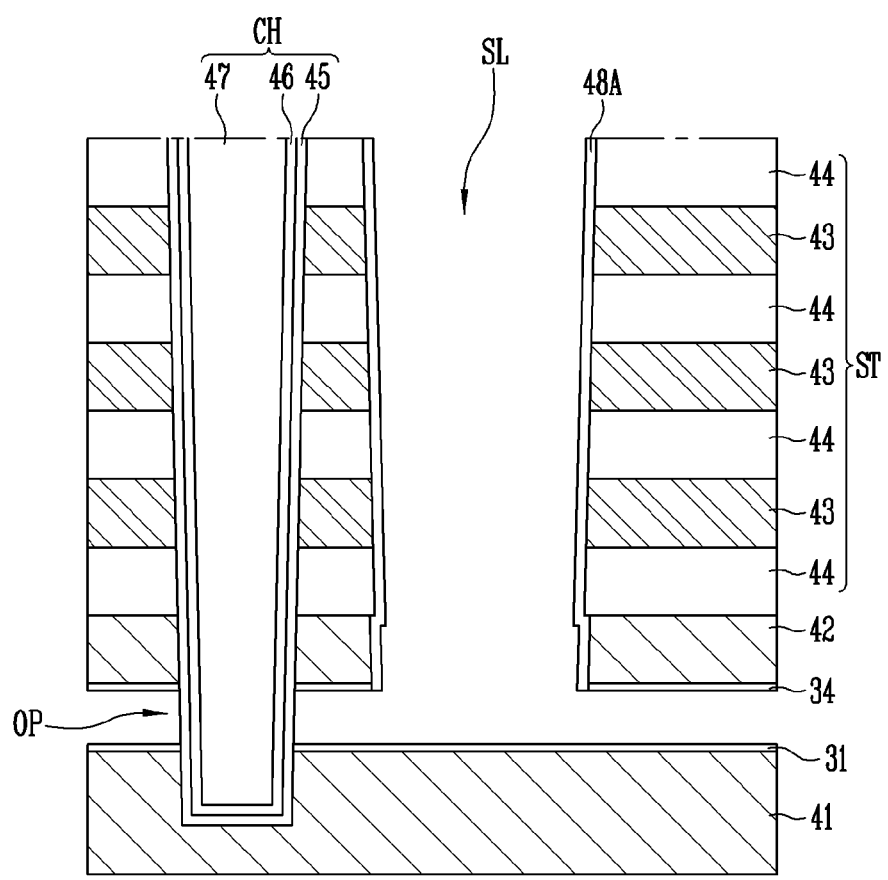

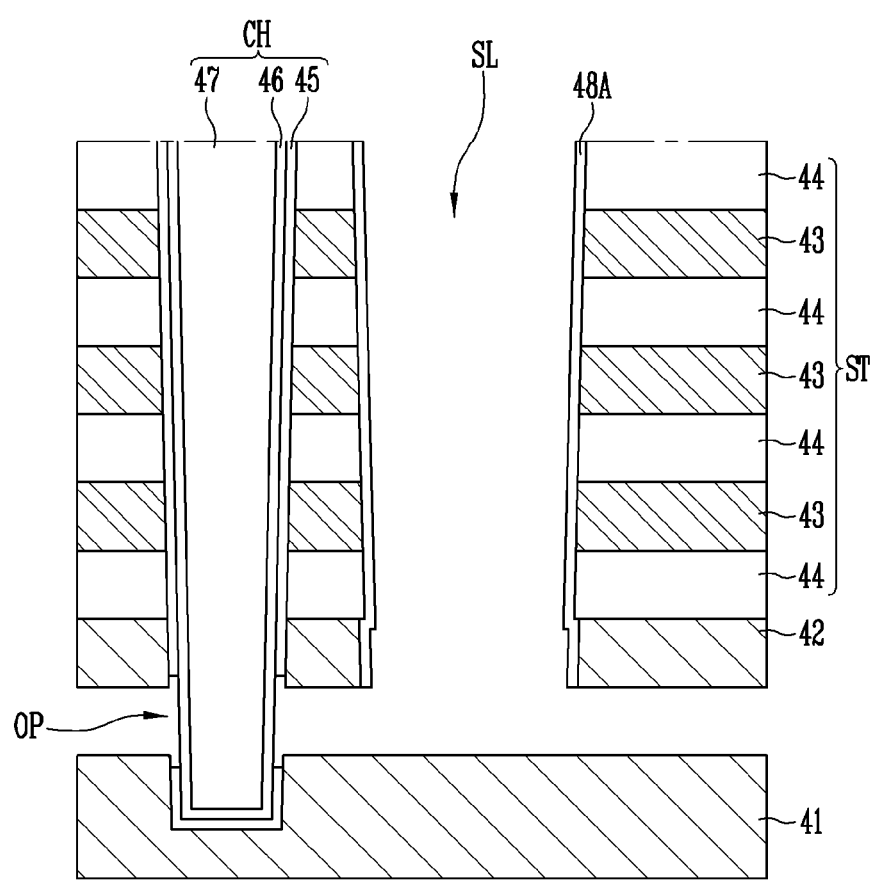

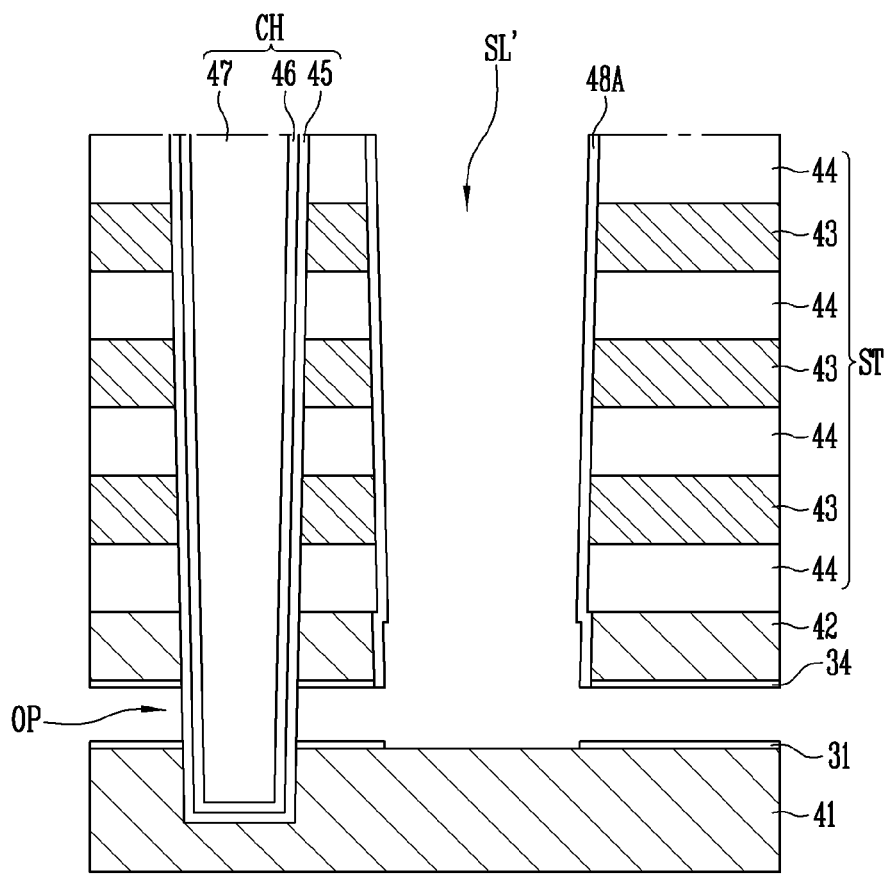

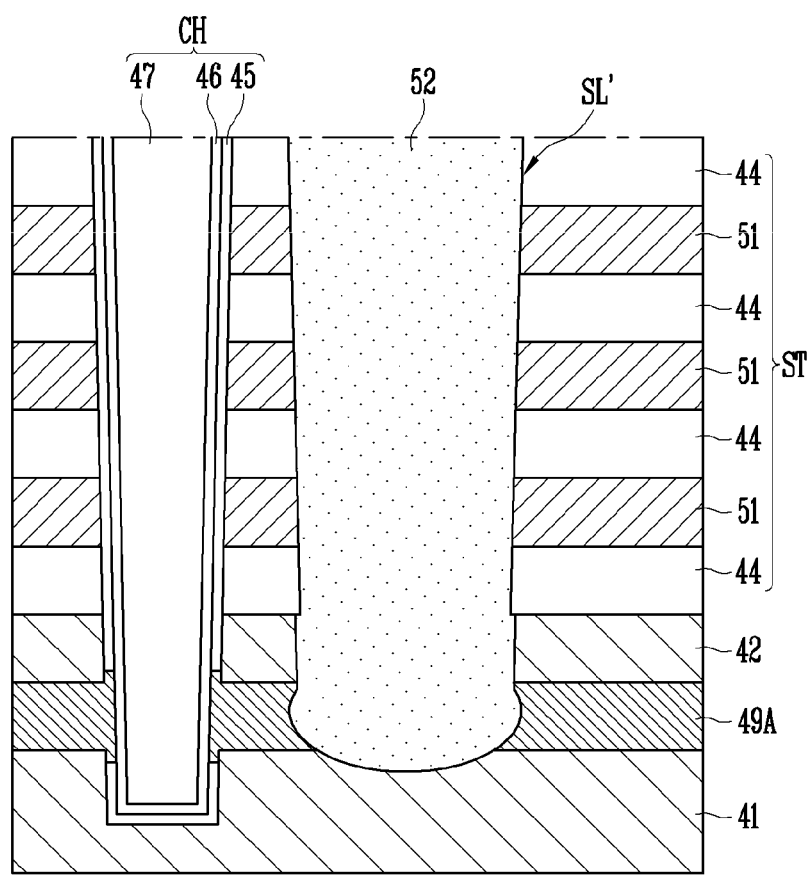

MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2019-0050639, filed on Apr. 30, 2019, which is incorporated herein by reference in its entirety.

BACKGROUND

Field of Invention

Various embodiments of the present disclosure generally relate to an electronic device, and more particularly, to a manufacturing method of a semiconductor device.

Description of Related Art

Non-volatile memory devices retain stored data even in the absence of a power supply. The increase in integration density of two-dimensional non-volatile memory devices in which memory cells are formed in a single layer over a substrate has been limited. Thus, three-dimensional non-volatile memory devices in which memory cells are stacked in a vertical direction over a substrate have been proposed.

A three-dimensional non-volatile memory device may include interlayer insulating layers and gate electrodes stacked alternately with each other, and channel layers passing therethrough, and memory cells may be stacked along the channel layers. Various structures and manufacturing methods have been developed to improve the operational reliability of non-volatile memory devices that have the three-dimensional structure.

SUMMARY

Various embodiments of the present disclosure are directed to a manufacturing method of a semiconductor device with easy manufacturing processes, a stabilized structure, and improved characteristics.

According to an embodiment, a method of manufacturing a semiconductor device may include forming a first sacrificial layer including a nitride over a first source layer, forming a second sacrificial layer including aluminum oxide over the first sacrificial layer, forming a second source layer over the second sacrificial layer, forming a stacked structure over the second source layer, the stacked structure including first material layers and second material layers that are alternately stacked, forming a channel layer that passes through the stacked structure, the second source layer, the second sacrificial layer, and the first sacrificial layer, the channel layer being enclosed by a memory layer, forming a slit that passes through the stacked structure and the second source layer, the slit exposing the second sacrificial layer, forming a polysilicon spacer in the slit, forming an opening by removing the first sacrificial layer and the second sacrificial layer through the slit, exposing the channel layer by etching the memory layer through the opening, and forming a third source layer that contacts the channel layer in the opening.

According to an embodiment, a method of manufacturing a semiconductor device may include forming a sacrificial structure that includes first, second, third, and fourth sacrificial layers, forming a stacked structure over the sacrificial structure, the stacked structure including first material layers and second material layers that are alternately stacked, forming a channel layer that passes through the stacked structure and the sacrificial structure, the channel layer being enclosed by a memory layer, forming a slit that passes through the stacked structure and the fourth sacrificial layer, the slit exposing the third sacrificial layer, forming a polysilicon spacer in the slit, exposing the second sacrificial layer by etching the third sacrificial layer through the slit, forming an opening that exposes the memory layer by removing the second and third sacrificial layers through the slit, removing a part of the memory layer, the first sacrificial layer, and the fourth sacrificial layer to expose the channel layer, and forming a source layer that contacts the channel layer in the opening.

According to an embodiment, a method of manufacturing a semiconductor device may include sequentially forming first, second, third, and fourth sacrificial layers over a first source layer to form a sacrificial structure, forming a second source layer over the sacrificial structure, forming a stacked structure over the second source layer, the stacked structure including first material layers and second material layers that are alternately stacked, forming a channel layer that passes through the stacked structure, the second source layer, and the sacrificial structure, and forming a memory layer that encloses the channel layer, forming a slit that passes through the stacked structure, the second source layer, and the fourth sacrificial layer and exposes the third sacrificial layer, forming a polysilicon spacer in the slit, exposing the first source layer by etching the first, second, and third sacrificial layers using the polysilicon spacer as a protective layer, forming an opening that exposes the memory layer by removing the second and third sacrificial layers using the polysilicon spacer as the protective layer, removing a part of the memory layer, the first sacrificial layer, and the fourth sacrificial layer to expose the channel layer, and forming a third source layer that contacts the channel layer in the opening.

BRIEF DESCRIPTION OF THE DRAWINGS

FIGS. 1A and 1B are diagrams illustrating the structure of a semiconductor device according to an embodiment of the present disclosure;

FIGS. 2A, 2B, 2C, 2D, 2E, 2F, 2G, 2H, and 2I are cross-sectional diagrams illustrating a method of manufacturing a semiconductor device according to an embodiment of the present disclosure;

FIGS. 3A, 3B, and 3C are cross-sectional diagrams illustrating a method of manufacturing a semiconductor device according to an embodiment of the present disclosure;

DETAILED DESCRIPTION

Figure 1B:
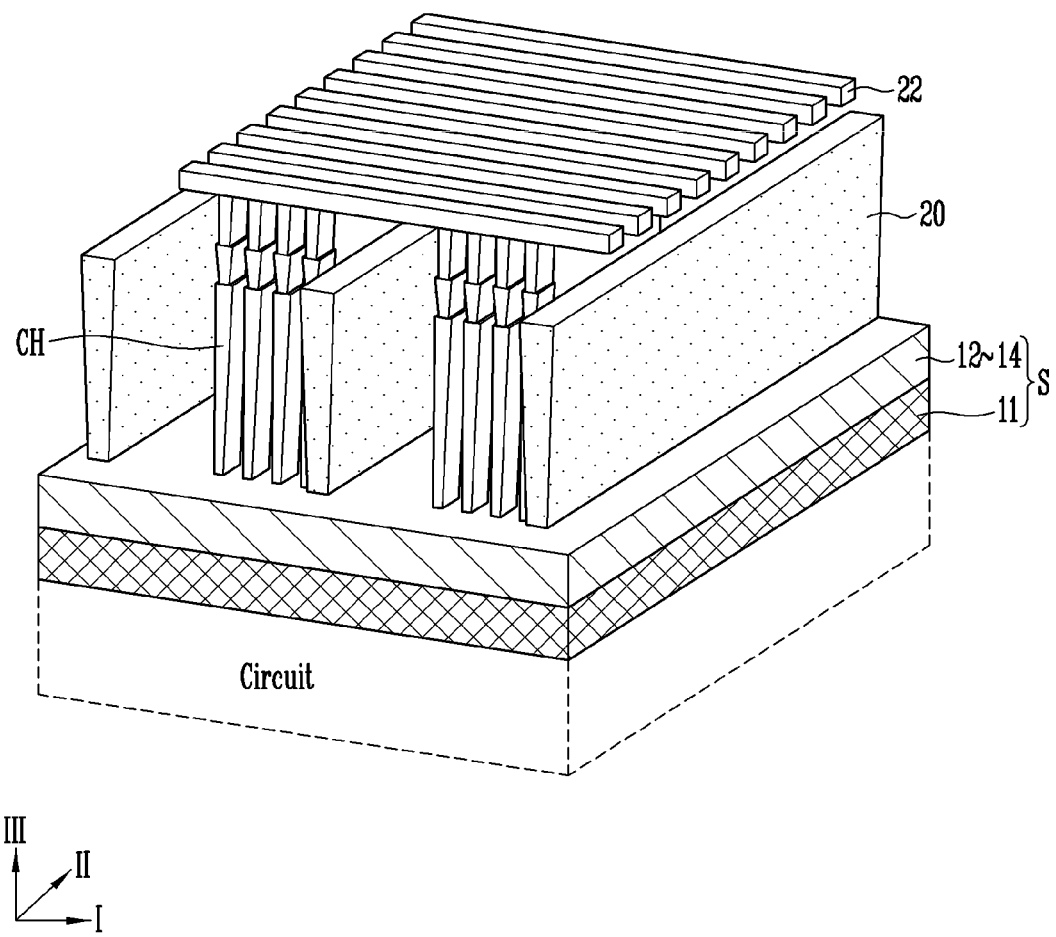

Hereinafter, various embodiments will be described in detail with reference to the accompanying drawings. In the drawings, thicknesses and distances of components may be exaggerated compared to the actual physical thicknesses and distances for convenience of illustration. In the following description, a detailed description of known related functions and constitutions may be omitted for simplicity and conciseness. Like reference numerals refer to like components throughout the specification and drawings.

It is also noted that in this specification, "connected/coupled" refers to one component not only "directly connected/coupled" to another component but also "indirectly connected/coupled" to another component through an intervening component. In the specification, when a component is referred to as "comprising" or "including" a component, it may not exclude other components but may further include other components unless the specification describes otherwise.

FIGS. 1A and 1B are diagrams illustrating a structure of a semiconductor device according to an embodiment of the present disclosure. FIG. 1A is a cross-sectional view, and FIG. 1B is a perspective view.

Referring to FIG. 1A, a semiconductor device according to an embodiment of the present disclosure may include a source structure S, a stacked structure ST, and a channel structure CH. The semiconductor device may further include a slit SL and a slit insulating layer 20.

The source structure S may have a multilayer structure and include first, second, third, and fourth source layers 11, 12, 13, and 14 which are sequentially stacked. The first, second, third, and fourth source layers 11, 12, 13, and 14 may include the same material or different materials, and have substantially the same resistance or different resistance. Furthermore, the first, second, third, and fourth source layers 11, 12, 13, and 14 may have substantially the same thickness or different thicknesses.

The first source layer 11 may have a lower resistivity that that of each of the second, third, and fourth source layers 12, 13, and 14. The first source layer 11 may include metal, and each of the second, third, and fourth source layers 12, 13, and 14 may include polysilicon. For example, the first source layer 11 may be a metal plate, and each of the second, third, and fourth source layers 12, 13, and 14 may be a polysilicon layer.

The stacked structure ST may include conductive layers 15 and insulating layers 16 stacked alternately with each other. The conductive layers 15 may serve as a gate electrode of a memory cell, a select transistor, or the like. The insulating layers 16 may be configured to insulate adjacent stacked conductive layers 15 from each other. The conductive layers 15 may include polysilicon, tungsten, metal, a metal nitride, or the like. The insulating layers 16 may include an oxide, a nitride, or the like.

The channel structure CH may pass through a part of the source structure S, and the stacked structure ST. The channel structure CH may include a channel layer 18 and a memory layer 17 enclosing the channel layer 18. The channel structure CH may further include a gap-fill layer 19 in the channel layer 18.

The channel layer 18 may be configured to form a channel of a memory cell, a select transistor, or the like, and include a semiconductor material such as silicon (Si), germanium (Ge), or silicon-germanium (SiGe). The memory layer 17 may include one or more of a tunnel insulating layer, a data storage layer, and a charge blocking layer. The data storage layer may include a floating gate, a charge trapping material, a nanostructure, a variable resistance material, a phase change material, or the like. The gap-fill layer 19 may include an insulating material such as an oxide, and include an air gap therein.

The memory layer 17 may include an opening that partially exposes the sidewall of the channel layer 18. The third source layer 13 may contact the channel layer 18 through the opening of the memory layer 17. In other words, the third source layer 13 may pass through the memory layer 17 to be directly coupled to the channel layer 18.

The structure as described above may form a current path from the channel layer 18 to the source structure S (indicated by a dashed arrow shown in FIG. 1A). A current may flow to the first source layer 11 which has relatively low resistance in the source structure S.

Referring to FIG. 1B, a plurality of channel structures CH may be arranged in a first direction I and a second direction II crossing the first direction I. Adjacent channel structures CH in the first direction I may be offset in the second direction II, or adjacent channel structures CH in the second direction II may be offset in the first direction I. In addition, each of the channel structures CH may extend in a third direction III crossing the first direction I and the second direction II. As described above with reference to FIG. 1A, the channel structures CH may pass through a part of the source structure S, and the stacked structure ST. However, in FIG. 1B, for better understanding, the stacked structure ST of FIG. 1A is omitted and only a part of the channel structures CH are illustrated.

The channel structures CH may be coupled between bit lines 22 and the source structure S. The bit lines 22 may include metal, for example, copper (Cu).

The source structure S may include the first source layer 11 including metal, and the second, third, and fourth source layers 12, 13, and 14 each including polysilicon. The first source layer 11 may have a plate shape expanding along a plane defined by the first direction I and the second direction II. The second, third, and fourth source layers 12, 13, and 14 may be located above the first source layer 11, and an upper surface of the first source layer 11 may directly contact a lower surface of the second source layer 12. Each of the second, third, and fourth source layers 12, 13, and 14 may have a plate shape expanding along a plane defined by the first direction I and the second direction II.

A plurality of slit insulating layers 20 may each extend in the second direction II to be parallel with each other. A plurality of channel structures CH may be located between adjacent slit insulating layers 20. For example, a plurality of channel structures CH are arranged in the second direction II to form a single row, and each of a plurality of rows of the channel structures CH may be located between adjacent slit insulating layers 20.

A peripheral circuit CIRCUIT, an interconnection structure, or the like may be located under the source structure S. The interconnection structure may include a contact plug, a wire, or the like, and electrically couple the peripheral circuit CIRCUIT and the source structure S. The peripheral circuit CIRCUIT may include a decoder, or the like.

FIG. 1B illustrates a structure in which the source structure S is located under the channel structure CH and the peripheral circuit CIRCUIT is located under the source structure S. However, embodiments of the present disclosure are not limited thereto, and a structure according to an embodiment of the present disclosure may include the channel structure CH, the source structure S, and the peripheral circuit CIRCUIT located in a different order. For example, the source structure S may be located under the peripheral circuit CIRCUIT, and the channel structure CH may be located under the source structure S.

FIGS. 2A, 2B, 2C, 2D, 2E, 2F, 2G, 2H, and 2I are cross-sectional views illustrating a method of manufacturing a semiconductor device according to an embodiment of the present disclosure. Hereinafter, repetitive detailed descriptions of components described above will be omitted for the interest of brevity.

Figure 2A:
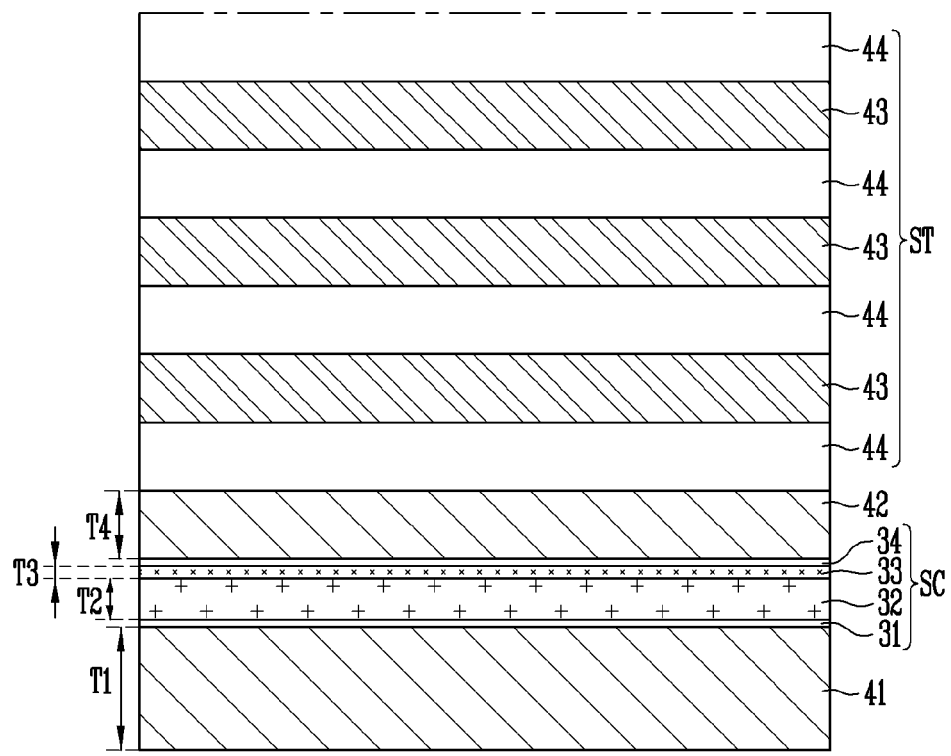

Referring to FIG. 2A, a sacrificial structure SC may be formed above a first source layer 41, and a second source layer 42 may be formed above the sacrificial structure SC. Subsequently, the stacked structure ST may be formed above the second source layer 42. The stacked structure ST may include first material layers 43 and second material layers 44 which are alternately stacked on each other. The first source layer 41 may be formed above a metal layer (e.g., the source layer 11 in FIG. 1A). The metal layer may be a source layer and have a plate shape.

The first source layer 41 and the second source layer 42 may be conductive layers. For example, each of the first source layer 41 and the second source layer 42 may include polysilicon. The first source layer 41 may be a first polysilicon layer and the second source layer 42 may be a second polysilicon layer. The first source layer 41 may have a greater thickness than the second source layer 42. In an embodiment, a thickness T1 of the first source layer 41 may be from 1000 Å to 2000 Å, and a thickness T4 of the second source layer 42 may be from 600 Å to 1200 Å. For example, the thickness T1 of the first source layer 41 may be from about one and a half to about three times as great as the thickness T4 of the second source layer 42.

The first material layers 43 may be configured to form gate electrodes of memory cells, select transistors, or the like. The second material layers 44 may be configured to insulate the stacked gate electrodes from each other. The first material layers 43 may include a material having high etch selectivity with respect to the second material layers 44. For example, the first material layers 43 may include a sacrificial material such as a nitride, whereas the second material layers 44 may be insulating layers including an oxide, or the like. Alternatively, the first material layers 43 may be conductive layers including polysilicon, tungsten, or the like, and the second material layers 44 may be insulating layers including an oxide, or the like. In another example, the first material layers 43 may be conductive layers including doped polysilicon, or the like, and the second material layers 44 may include a sacrificial material such as undoped polysilicon.

The sacrificial structure SC may be configured to secure a space in which a third source layer (e.g., a third source layer 49A in FIG. 2H) is formed between the first source layer 41 and the second source layer 42. The sacrificial structure SC may be a multilayer film and include layers to serve as an etch stop layer, a protective layer, or the like.

The sacrificial structure SC may include a second sacrificial layer 32, and a third sacrificial layer 33 above the second sacrificial layer 32. The third sacrificial layer 33 may include a material having high etch selectivity with respect to the first and second material layers 43 and 44, the second source layer 42, and a fourth sacrificial layer 34. When the first material layer 43 includes a nitride, the second material layer 44 includes an oxide, the second source layer 42 includes polysilicon, and the fourth sacrificial layer 34 includes an oxide, the third sacrificial layer 33 may include aluminum oxide. In addition, the third sacrificial layer 33 may include a material having a higher etch rate than the second sacrificial layer 32. The second sacrificial layer 32 may include a nitride, and the third sacrificial layer 33 may include aluminum oxide.

The second sacrificial layer 32 may have a thickness T2 greater than a thickness T3 of the third sacrificial layer 33 (T2>T3). In an embodiment, the second sacrificial layer 32 may have the thickness T2 from 300 Å to 450 Å, and the third sacrificial layer 33 may have the thickness T3 from 10 Å to 50 Å. For example, the thickness T2 of the second sacrificial layer 32 may be from about ten to about fifteen times as great as the thickness T3 of the third sacrificial layer 33.

The sacrificial structure SC may further include a first sacrificial layer 31 and the fourth sacrificial layer 34. As a result, the sacrificial structure SC may include the first, second, third, and fourth sacrificial layers 31, 32, 33, and 34 which are sequentially stacked. The first and fourth sacrificial layers 31 and 34 may serve as protective layers to protect the first and second source layers 41 and 42 during a subsequent process for replacing the sacrificial structure SC with the third source layer. The first and fourth sacrificial layers 31 and 34 may include a material having a lower etch rate than that of the second and third sacrificial layers 32 and 33. When the second sacrificial layer 32 includes a nitride and the third sacrificial layer 33 includes aluminum oxide, the first and fourth sacrificial layers 31 and 34 may include oxides. In addition, the first and fourth sacrificial layers 31 and 34 may include one or more materials that are same as a memory layer 45. For example, the first and fourth sacrificial layers 31 and 34 may be silicon oxide layers.

The first sacrificial layer 31 and the fourth sacrificial layer 34 may include the same material or different materials. The first sacrificial layer 31 and the fourth sacrificial layer 34 may have substantially the same thickness or different thicknesses. Each of the first and fourth sacrificial layers 31 and 34 may have a smaller thickness than the thickness T3 of the third sacrificial layer 33. Each of the first and fourth sacrificial layers 31 and 34 may have a smaller thickness than the thickness T2 of the second sacrificial layer 32.

Figure 2B:
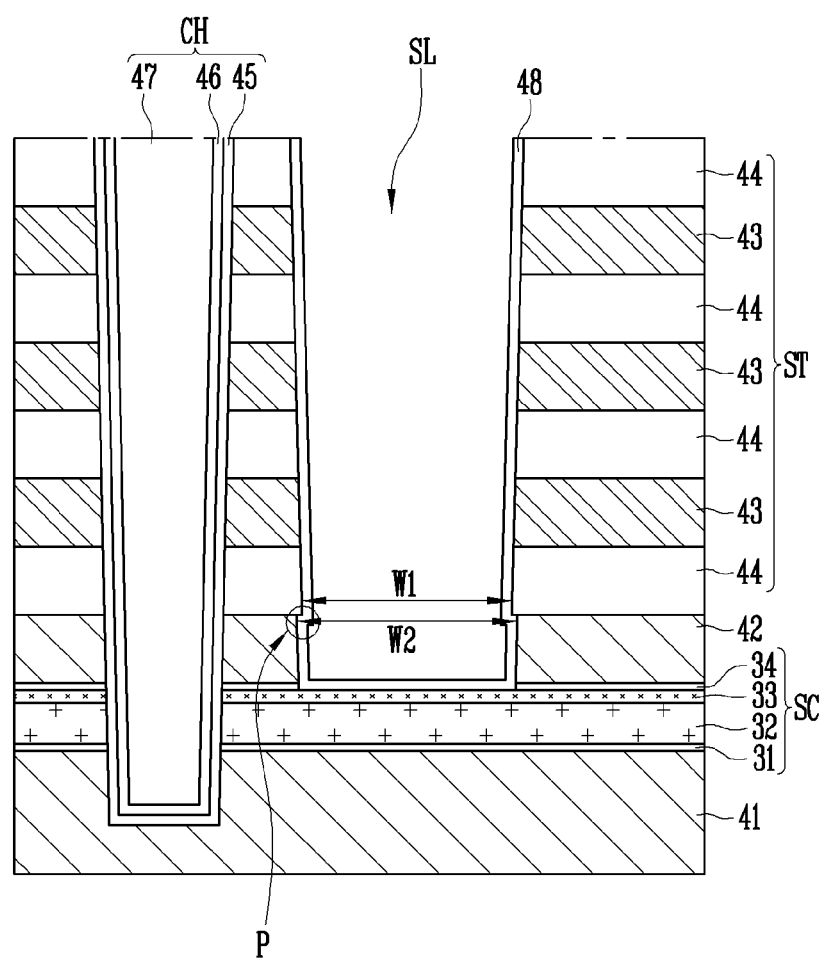

Referring to FIG. 2B, a channel structure CH, which passes through the stacked structure ST, the second source layer 42, and the sacrificial structure SC, may be formed. The channel structure CH may further extend into the first source layer 41. A bottom surface of the channel structure CH may be located higher than a bottom surface of the first source layer 41. The channel structure CH may include a channel layer 46 and the memory layer 45 enclosing the channel layer 46, and further include a gap-fill layer 47 in the channel layer 46.

Subsequently, a first slit SL passing through the stacked structure ST and the second source layer 42 may be formed. In another embodiment, the slit SL may be formed before the channel structure CH is formed. The slit SL may further pass through the fourth sacrificial layer 34, and expose the third sacrificial layer 33. The third sacrificial layer 33 may include a material having high etch selectivity with respect to the first and second material layers 43 and 44, the second source layer 42, and the fourth sacrificial layer 34. Accordingly, an etch rate of the third sacrificial layer 33 may be lower than an etch rate of the first and second material layers 43 and 44, the second source layer 42, and the fourth sacrificial layer 34, when the slit SL is formed. In addition, the third sacrificial layer 33 may serve as an etch stop layer, when the slit SL is formed.

The slit SL may have a tapered cross section in which a width decreases from an upper portion toward a lower portion thereof. In addition, a sidewall of the slit SL may have an outwardly protruding portion P at an interface between the second source layer 42 and the stacked structure ST. For example, a width W1 of the slit SL at a first level corresponding to a bottom surface of the stacked structure ST may be different from a width W2 of the slit SL at a second level corresponding to an upper surface of the second source layer 42 may be different, and the width W2 may be greater than the width W1. A difference in width may be caused by a difference in etch rate between the stacked structure ST and the second source layer 42, and adjustment of an etch recipe.

Subsequently, a spacer material layer 48 may be formed in the slit SL. The spacer material layer 48 may be conformally formed on an inner wall and a bottom surface of the slit SL. The spacer material layer 48 may include a material having high etch selectivity with respect to the second sacrificial layer 32, the third sacrificial layer 33, and the memory layer 45.

When the second sacrificial layer 32 includes a nitride and the memory layer 45 includes an oxide, or a nitride, or both, the spacer material layer 48 may include polysilicon. The spacer material layer 48 may be a polysilicon layer and a single layer. For example, a thickness of the spacer material layer 48 may be from 2 nm to 6 nm.

Figure 2C:
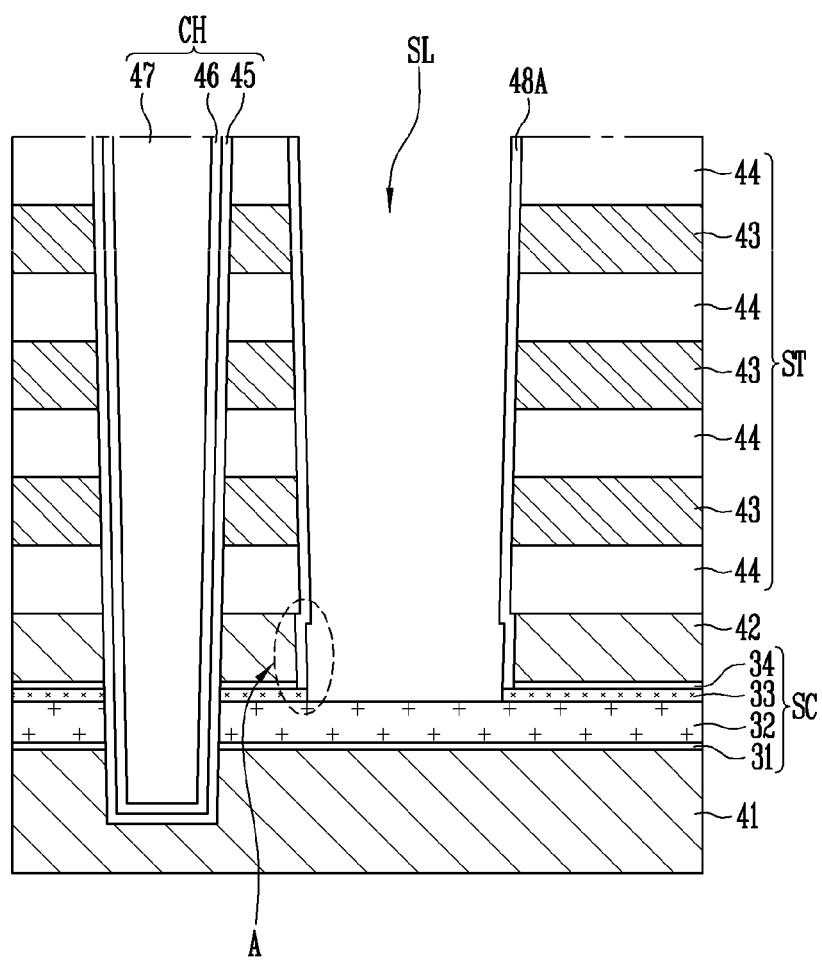

Referring to FIG. 2C, a spacer 48A including polysilicon may be formed on the inner wall of the slit SL by etching the spacer material layer 48. For example, the spacer 48A may be a polysilicon layer and a single layer. The spacer material layer 48 may be etched using a blanket etching process. Accordingly, an area of the spacer material layer 48 which is formed on the bottom surface of the slit SL may be etched and the third sacrificial layer 33 may be exposed. An area of the spacer material layer 48 which is formed on the inner wall of the slit SL might not be etched but remain to form the spacer 48A. In addition, an area A of the spacer 48A which is adjacent to the bottom surface of the slit SL may be less exposed to an etching environment due to the protruding portion P of FIG. 2B. Accordingly, the loss of a material in the area A during the etching process may be reduced.

Subsequently, the third sacrificial layer 33 may be etched using the spacer 48A as a protective layer. The third sacrificial layer 33 may be etched using a dry etching process. During the etching process of the third sacrificial layer 33, the first and second material layers 43 and 44 may be protected by the spacer 48A. When the third sacrificial layer 33 is etched, the second sacrificial layer 32 may be exposed. The second sacrificial layer 32 may have the thickness T2 greater than the thickness T3 of the third sacrificial layer 33, and may serve as an etch stop layer during an etching process for forming the spacer 48A.

Referring to FIGS. 2D and 2E, the second sacrificial layer 32 and the third sacrificial layer 33 may be removed using the spacer 48A as a protective layer. During the etching process of the second sacrificial layer 32 and the third sacrificial layer 33, an etch rate of the spacer material layer 48 may be lower than an etch rate of the second sacrificial layer 32 and the third sacrificial layer 33. Thus, the first and second material layers 43 and 44 may be protected by the spacer 48A. Accordingly, an opening OP may be formed and the memory layer 45 may be exposed through the opening OP. The second sacrificial layer 32 and the third sacrificial layer 33 may have high etch selectivity with respect to the spacer 48A and the memory layer 45. For example, the second sacrificial layer 32 and the third sacrificial layer 33 each may have a higher etch rate than the spacer 48A and the memory layer 45, and thus the second sacrificial layer 32 and the third sacrificial layer 33 may be selectively etched. The first sacrificial layer 31 and the fourth sacrificial layer 34 may remain. Accordingly, the first source layer 41 and the second source layer 42 might not be exposed and may be protected by the first sacrificial layer 31 and the fourth sacrificial layer 34.

When the second sacrificial layer 32 is a nitride layer and the third sacrificial layer 33 is an aluminum oxide layer, the second and third sacrificial layers 32 and 33 may be removed using phosphoric acid. In addition, since the aluminum oxide layer 33 has a higher etch rate than the nitride layer 32, and the third sacrificial layer 33 has a smaller thickness T3 than the thickness T2 of the second sacrificial layer 32, the third sacrificial layer 33 may be removed whereas the second sacrificial layer 32 remains as shown in FIG. 2D. A portion from which the third sacrificial layer 33 is removed may serve as a path through which etchant flows. The flow of the etchant through the path may increase an etch rate for the second sacrificial layer 32, thereby increasing the efficiency of the etching process of the second sacrificial layer 32. Accordingly, when the phosphoric acid may flow through the area from which the third sacrificial layer 33 is removed, the second sacrificial layer 32 may be selectively removed as shown in FIG. 2E.

Referring to FIG. 2F, the memory layer 45 may be partially etched using the spacer 48A as a protective layer. When the memory layer 45 is partially etched, an etch rate of the spacer material layer 48 may be lower than an etch rate of the memory layer 45. Thus, the first and second material layers 43 and 44 may be protected by the spacer 48A. Accordingly, the channel layer 46 may be partially exposed by the opening OP. In addition, when the memory layer 45 is etched, the first sacrificial layer 31 and the fourth sacrificial layer 34 may be also etched. The first sacrificial layer 31, the fourth sacrificial layer 34, and the memory layer 45 may have high etch selectivity with respect to the spacer 48A. For example, the first sacrificial layer 31, the fourth sacrificial layer 34, and the memory layer 45 each may have a higher etch rate than the spacer 48A, and thus a part of the memory layer 45, the first sacrificial layer 31, and the fourth sacrificial layer 34 may be selectively etched using the spacer 48A as a protective layer. Therefore, the first source layer 41 and the second source layer 42 may be exposed by the opening OP.

Figure 2G:
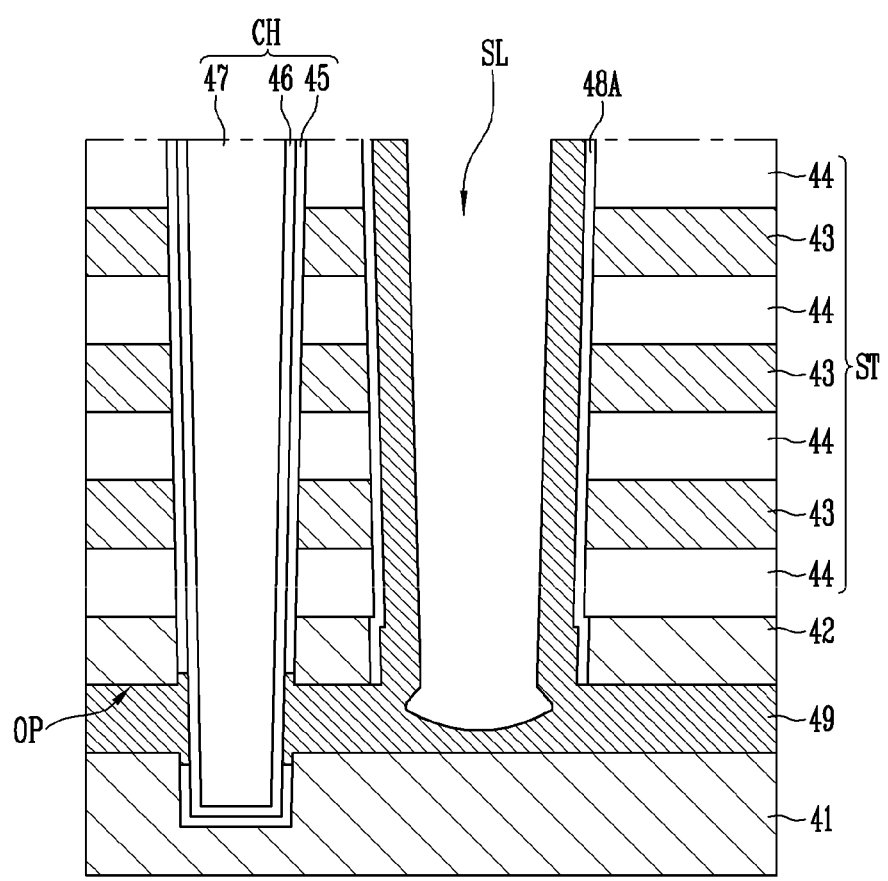

Referring to FIG. 2G, a third source material layer 49 may be formed in the opening OP and the slit SL. For example, a polysilicon layer may be deposited to fill the opening OP. According to the embodiment shown in FIG. 2G, the polysilicon layer may be deposited not only inside the opening OP but also inside the slit SL. In another embodiment, the third source material layer (not shown) may be formed in the opening OP using a selective growth method. For example, a polysilicon layer may grow from the channel layer 46, the first source layer 41, and the second source layer 42 to fill the opening OP.

Figure 2H:
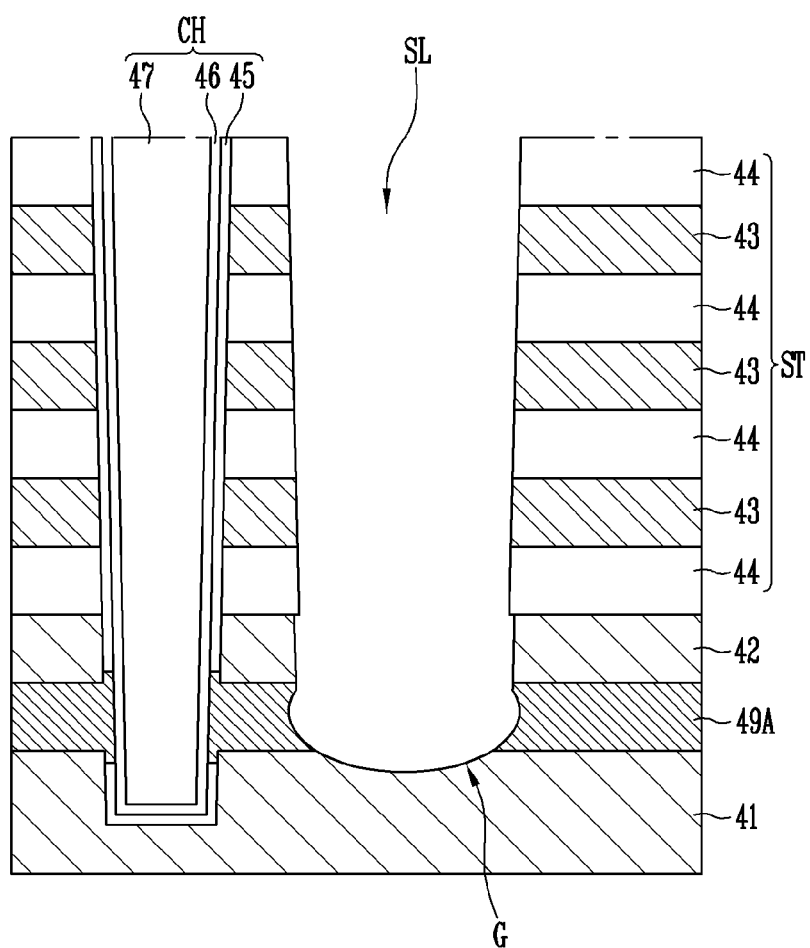

Referring to FIG. 2H, a third source layer 49A may be formed by etching the third source material layer 49. For example, the third source material layer 49 may be etched using a wet etching process. Accordingly, the third source material layer 49 in the slit SL may be etched and the third source layer 49A may be formed in the opening OP. The third source layer 49A may contact the channel layer 46. For example, the third source layer 49A may pass through the memory layer 45 to directly contact the channel layer 46.

When the third source material layer 49 is etched, the first source layer 41 may be exposed. Accordingly, an upper surface of the first source layer 41 may be partially etched to form a groove G. The groove G may be formed at an upper surface of the first source layer 41. The groove G may be located under the slit SL.

When the third source material layer 49 is etched, the spacer 48A may be also etched. Accordingly, the first and second material layers 43 and 44 may be exposed by the slit SL. In addition, when the spacer 48A is etched, the protruding portion P of FIG. 2B of the sidewall of the slit SL may remain or be removed according to etching conditions.

Figure 2I:
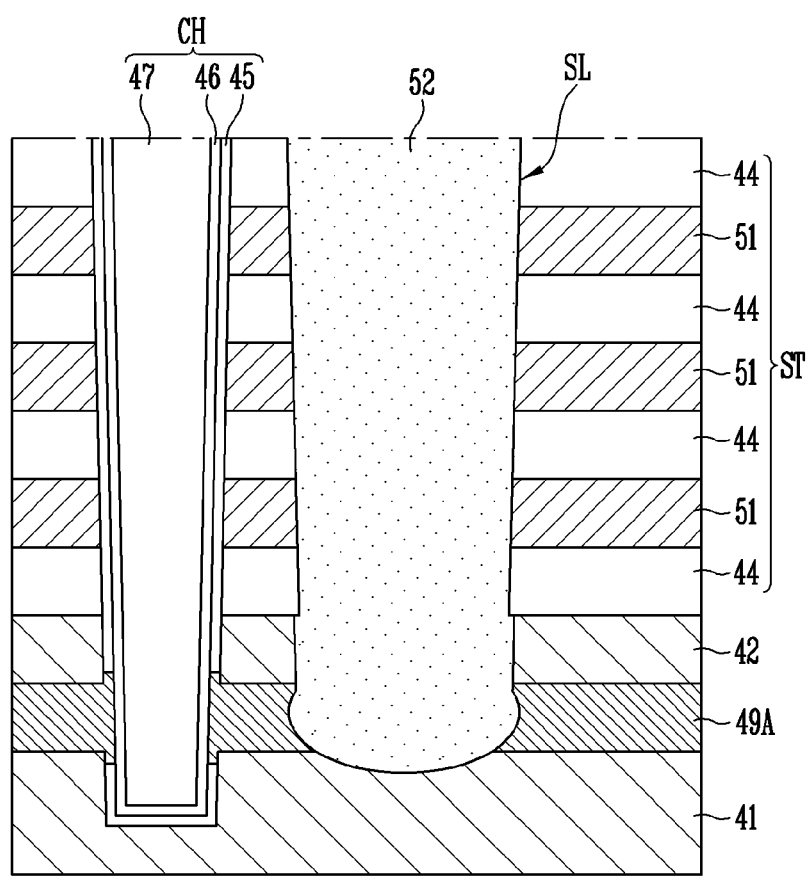

Referring to FIG. 2I, either the first material layers 43 or the second material layers 44 may be replaced by third material layers 51 through the slit SL. In the embodiment shown in FIG. 2I where the first material layers 43 are sacrificial layers and the second material layers 44 are insulating layers, the first material layers 43 may be replaced by conductive layers. Alternatively, when the first material layers 43 are conductive layers and the second material layers 44 are insulating layers, the first material layers 43 may be silicidized to form the third material layers 51. As a further alternative, when the first material layers 43 are conductive layers and the second material layers 44 are sacrificial layers, the second material layers 44 may be replaced by insulating layers (not shown).

Subsequently, an insulating layer 52 may be formed in the slit SL. The insulating layer 52 may include an oxide.

According to the process as described above, the spacer 48A having a single layer structure may be formed in the slit SL of FIG. 2C. Accordingly, a width of the slit SL may be less decreased compared to a width of a slit in the case where a spacer having a multilayer structure is formed.

In addition, a metal plate (e.g., the source layer 11 in FIG. 1A) may be formed under the first source layer 41 and the insulating layer 52 may be formed in the slit SL. As only the insulating layer 52 is formed in the slit SL, a structure and a process may be simplified compared to the structure in which a conductive source contact structure is formed in the slit SL with the insulating layer 52.

Figure 3A:
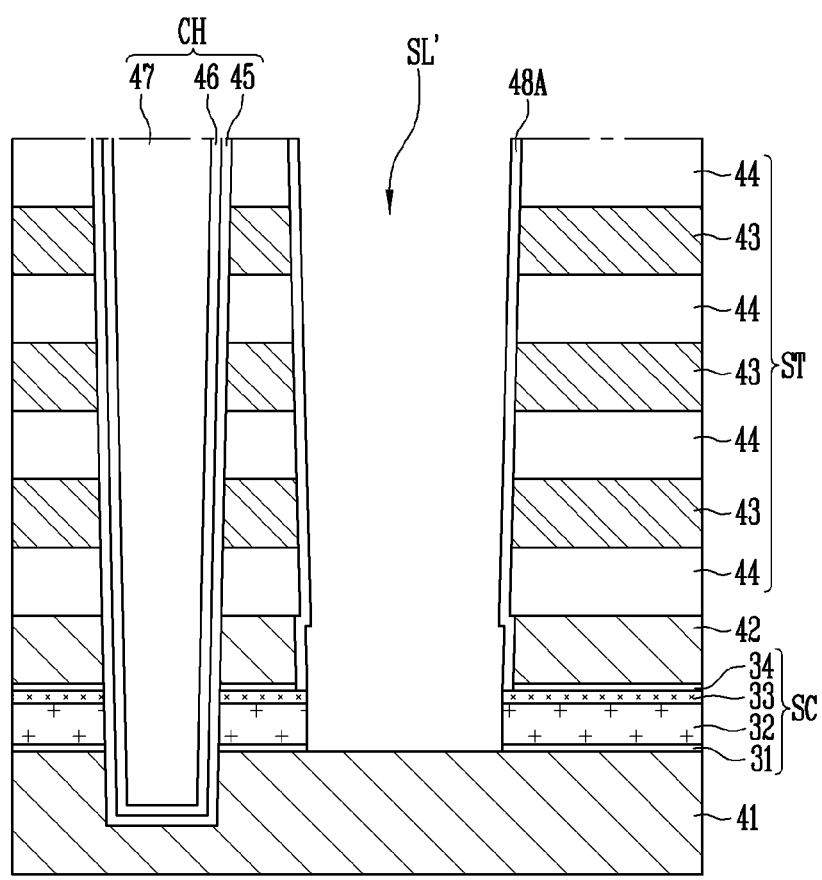

FIGS. 3A, 3B, and 3C are cross-sectional views illustrating a method of manufacturing a semiconductor device according to an embodiment of the present disclosure. Hereinafter, repetitive detailed descriptions of components described above will be omitted for the interest of brevity.

FIG. 3A illustrates a process corresponding to that described above with reference to FIG. 2C, according to an embodiment. The processes before a process to be described below may be substantially the same as the processes described above with reference to FIGS. 2A and 2B. Referring to FIG. 3A, the spacer 48A may be formed by etching a part of the spacer material layer 48 of FIG. 2B and a part of the sacrificial structure SC.

First, the spacer 48A may be formed by etching an area of the spacer material layer 48 which is formed at a bottom surface of a slit SL'. Subsequently, by using the spacer 48A as a protective layer, the third sacrificial layer 33 and the second sacrificial layer 32 may be etched. In addition, the first sacrificial layer 31 may be further etched. When the first sacrificial layer 31, in addition to the third sacrificial layer 33 and the second sacrificial layer 32, is etched, the first source layer 41 may be exposed. In the embodiment shown in FIG. 3A, the first source layer 41 may serve as an etch stop layer. According to this example, a thickness of the sacrificial structure SC may be decreased compared to the thickness of the sacrificial structure SC according to the embodiment described above with reference to FIGS. 2A to 2H. For example, the thickness of the second sacrificial layer 32 in FIG. 3A may be decreased compared to the thickness T2 of the second sacrificial layer 32 in FIG. 2A. In addition, the thickness of the third sacrificial layer 33 in FIG. 3A may be decreased compared to the thickness T3 of the third sacrificial layer 33 in FIG. 2A.

Referring to FIG. 3B, an opening OP may be formed by removing the second sacrificial layer 32 and the third sacrificial layer 33 using the spacer 48A as a protective layer. The etching process may be performed under the condition in which the second sacrificial layer 32 and the third sacrificial layer 33 have high etch selectivity with respect to the spacer 48A, the memory layer 45, and the first source layer 41. For example, the second sacrificial layer 32 and the third sacrificial layer 33 each have a higher etch rate than the spacer 48A, the memory layer 45, and the first source layer 41. Accordingly, damage to the first source layer 41 may be reduced and the second sacrificial layer 32 and the third sacrificial layer 33 may be selectively etched.

Referring to FIG. 3C, a part of the memory layer 45, the first sacrificial layer 31, and the fourth sacrificial layer 34 may be etched using the spacer 48A as a protective layer. Subsequently, a source material layer (not shown) may be formed in the opening OP and the slit SL'. Then, the third source layer 49A may be formed in the opening OP by etching the source material layer in the slit SL' and the spacer 48A. Subsequently, either the first material layers 43 or the second material layers 44 may be replaced by third material layers 51. Subsequently, the insulating layer 52 may be formed in the slit SL'.

According to the manufacturing method as described above with reference to FIGS. 3A, 3B, and 3C, the thickness of the sacrificial structure SC of FIG. 3A may be decreased and the width of the slit SL' of FIG. 3C may be decreased compared to that of the sacrificial structure SC of FIG. 2A and that of the slit SL of FIG. 2I, respectively.

Figure 4:
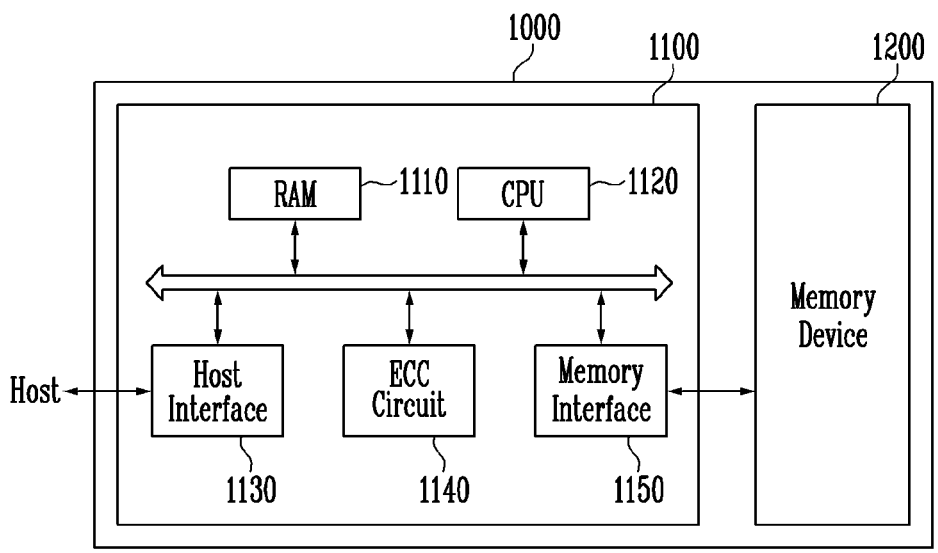
FIGS. 4 and 5 are block diagrams each illustrating the configuration of a memory system according to an embodiment of the present disclosure.

FIG. 4 is a block diagram illustrating the configuration of a memory system 1000 according to an embodiment of the present disclosure.

Referring to FIG. 4, the memory system 1000 may include a memory device 1200 and a controller 1100.

The memory device 1200 may be used to store data information having various data formats such as a text format, a graphical format, and a software code format. The memory device 1200 may be a non-volatile memory device. Furthermore, the memory device 1200 may have a structure consistent with embodiments described above with reference to FIGS. 1A to 3C, and may be manufactured by a manufacturing method consistent with embodiments described above with reference to FIGS. 1A to 3C. Since the memory device 1200 is configured and manufactured in the same manner as described above, a detailed description thereof will be omitted.

The controller 1100 may be coupled to a host and the memory device 1200 and configured to access the memory device 1200 in response to a request from the host. For example, the controller 1100 may control read, write, erase, and background operations of the memory device 1200.

The controller 1100 may include a Random Access Memory (RAM) 1110, a Central Processing Unit (CPU) 1120, a host interface 1130, an Error Correction Code (ECC) circuit 1140, a memory interface 1150, or the like.

The RAM 1110 may be used as an operation memory of the CPU 1120, a cache memory between the memory device 1200 and the host, a buffer memory between the memory device 1200 and the host, or the like. The RAM 1110 may be replaced with a Static Random Access Memory (SRAM), a Read Only Memory (ROM), or the like.

The CPU 1120 may control the overall operation of the controller 1100. For example, the CPU 1120 may operate firmware such as a Flash Translation Layer (FTL) stored in the RAM 1110.

The host interface 1130 may interface with the host. For example, the controller 1100 may communicate with the host through at least one of various interface protocols such as a Universal Serial Bus (USB) protocol, a MultiMedia Card (MMC) protocol, a Peripheral Component Interconnection (PCI) protocol, a PCI-Express (PCI-E) protocol, an Advanced Technology Attachment (ATA) protocol, a Serial- ATA protocol, a Parallel-ATA protocol, a Small Computer Small Interface (SCSI) protocol, an Enhanced Small Disk Interface (ESDI) protocol, an Integrated Drive Electronics (IDE) protocol, a private protocol, or the like.

The ECC circuit 1140 may use an Error Correction Code (ECC) to detect and correct errors in data read from the memory device 1200.

The memory interface 1150 may interface with the memory device 1200. For example, the memory interface 1150 may include a NAND interface or a NOR interface.

The controller 1100 may further include a buffer memory (not illustrated) for temporarily storing data. The buffer memory may be used to temporarily store data to be transferred to an external device through the host interface 1130 or data to be transferred from the memory device 1200 through the memory interface 1150. The controller 1100 may further include a ROM which stores code data to interface with the host.

Since the memory system 1000 according to the embodiment includes the memory device 1200 having improved integration density and characteristics, integration density and characteristics of the memory system 1000 may also be improved.

Figure 5:
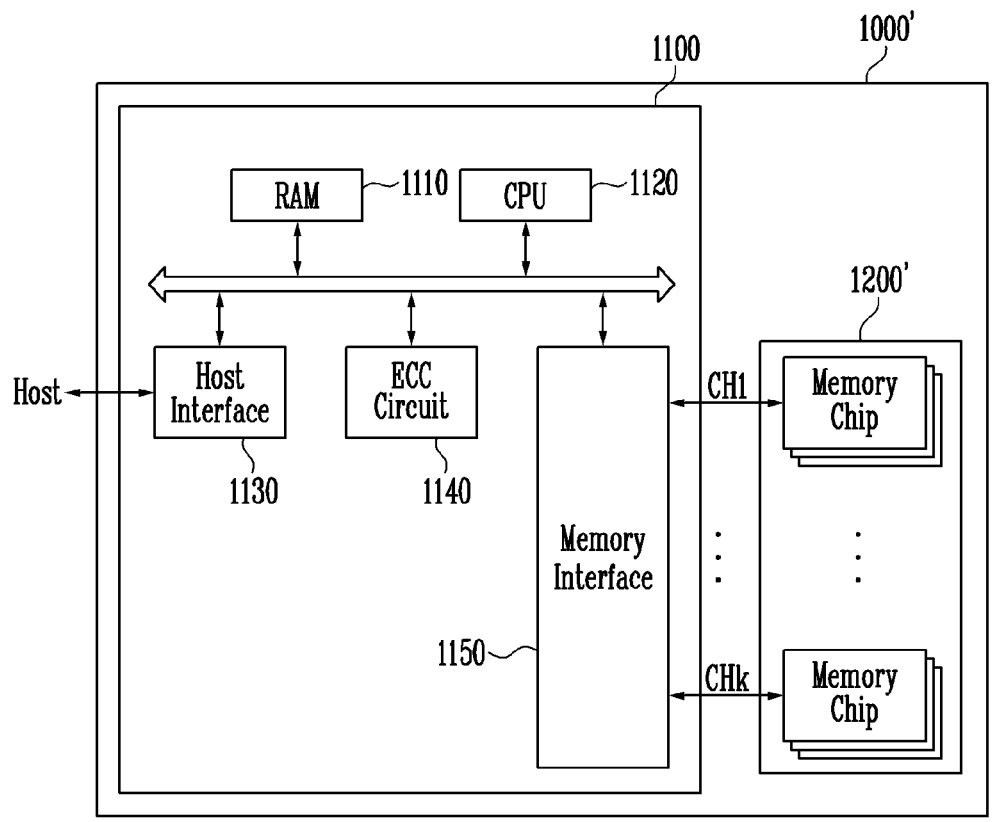

FIG. 5 is a block diagram illustrating the configuration of a memory system 1000' according to an embodiment of the present disclosure. Hereinafter, any repetitive detailed descriptions of components already described above will be omitted.

Referring to FIG. 5, the memory system 1000' according to an embodiment may include a memory device 1200' and the controller 1100. In addition, the controller 1100 may include the RAM 1110, the CPU 1120, the host interface 1130, the ECC circuit 1140, the memory interface 1150, or the like.

The memory device 1200' may be a non-volatile memory device. Furthermore, the memory device 1200' may have a structure consistent with embodiments described above with reference to FIGS. 1A to 3C, and may be manufactured by a manufacturing method consistent with embodiments described above with reference to FIGS. 1A to 3C. Since the memory device 1200' is configured and manufactured in the same manner as described above, a detailed description thereof will be omitted.

Furthermore, the memory device 1200' may be a multi-chip package including a plurality of memory chips. The plurality of memory chips may be divided into a plurality of groups, which may communicate with the controller 1100 through first to kth channels CH1 to CHk, respectively. In addition, memory chips included in a single group may be configured to communicate with the controller 1100 through a common channel. The memory system 1000' may be modified so that a single memory chip may be coupled to a single channel.

Since the memory system 1000' according to the embodiment includes the memory device 1200' having improved integration density and characteristics, the integration density and characteristics of the memory system 1000' may also be improved. Since the memory device 1200' is formed into a multi-chip package, data storage capacity and a driving speed of the memory system 1000' may be further increased.

Figure 6:
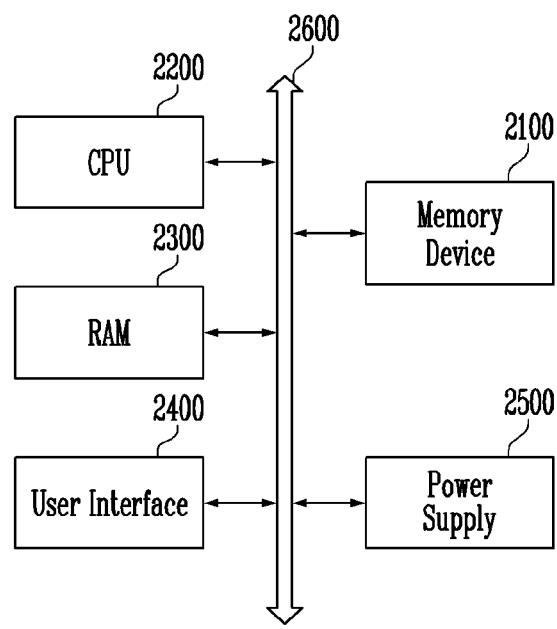
FIGS. 6 and 7 are block diagrams each illustrating the configuration of a computing system according to an embodiment of the present disclosure.

FIG. 6 is a block diagram illustrating the configuration of a computing system 2000 according to an embodiment of the present disclosure. Hereinafter, any repetitive detailed descriptions of components already described above will be omitted.

Referring to FIG. 6, the computing system 2000 according to an embodiment may include a memory device 2100, a Central Processing Unit (CPU) 2200, a Random Access Memory (RAM) 2300, a user interface 2400, a power supply 2500, a system bus 2600, or the like.

The memory device 2100 may store data provided via the user interface 2400, data processed by the CPU 2200, or the like. In addition, the memory device 2100 may be electrically coupled to the CPU 2200, the RAM 2300, the user interface 2400, and the power supply 2500 by the system bus 2600. For example, the memory device 2100 may be coupled to the system bus 2600 via a controller (not illustrated), alternatively, directly coupled to the system bus 2600. When the memory device 2100 is directly coupled to the system bus 2600, functions of the controller may be performed by the CPU 2200, the RAM 2300, or the like.

The memory device 2100 may be a non-volatile memory. Furthermore, the memory device 2100 may have a structure consistent with embodiments described above with reference to FIGS. 1A to 3C, and may be manufactured by a manufacturing method consistent with embodiments described above with reference to FIGS. 1A to 3C. Since the memory device 2100 is configured and manufactured in the same manner as described above, a detailed description thereof will be omitted.

In addition, as described above with reference to FIG. 5, the memory device 2100 may be a multi-chip package composed of a plurality of memory chips.

The computing system 2000 having the above-mentioned configuration may be a computer, an Ultra Mobile PC (UMPC), a workstation, a net-book, a Personal Digital Assistant (PDA), a portable computer, a web tablet, a wireless phone, a mobile phone, a smartphone, an e-book, a Portable Multimedia Player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to the embodiment of the present disclosure includes the memory device 2100 having improved integration density and characteristics, characteristics of the computing system 2000 may also be improved.

Figure 7:
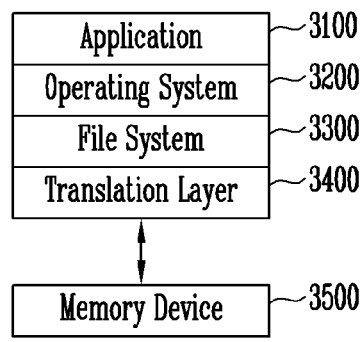

FIG. 7 is a block diagram illustrating a computing system 3000 according to an embodiment of the present disclosure.

Referring to FIG. 7, the computing system 3000 according to an embodiment may include a software layer which has an operating system 3200, an application 3100, a file system 3300, and a translation layer 3400. Furthermore, the computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data to be stored in the memory device 3500 according to given rules. The file system 3300 may be determined depending on the operating system 3200 used in the computing system 3000. For example, when the operating system 3200 is a Microsoft Windows-based system, the file system 3300 may be a File Allocation Table (FAT), an NT file system (NTFS), or the like. In addition, when the operating system 3200 is a Unix/Linux system, the file system 3300 may be an extended file system (EXT), a Unix File System (UFS), a Journaling File System (JFS), or the like.

FIG. 7 illustrates the operating system 3200, the application 3100, and the file system 3300 in separate blocks. However, the application 3100 and the file system 3300 may be included in the operating system 3200.

The translation layer 3400 may translate an address into a suitable form for the memory device 3500 in response to a request from the file system 3300. For example, the translation layer 3400 may translate a logical address, generated by the file system 3300, into a physical address of the memory device 3500. Mapping information of the logical address and the physical address may be stored in an address translation table. For example, the translation layer 3400 may be a Flash Translation Layer (FTL), a Universal Flash Storage Link Layer (ULL), or the like.

The memory device 3500 may be a non-volatile memory. Furthermore, the memory device 3500 may have a structure consistent with embodiments described above with reference to FIGS. 1A to 3C, and may be manufactured by a manufacturing method consistent with embodiments described above with reference to FIGS. 1A to 3C. Since the memory device 3500 is configured and manufactured in the same manner as described above, a detailed description thereof will be omitted.

The computing system 3000 having the above-described configuration may be divided into an operating system layer that is operated in an upper level region and a controller layer that is operated in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to an embodiment includes the memory device 3500 having improved integration density and characteristics, characteristics of the computing system 3000 may also be improved.

According to the various embodiments of the present disclosure, a semiconductor device having a stabilized structure and improved reliability may be provided. In addition, a method of manufacturing a semiconductor device may be simplified with a lower level of difficulty of processes and lower manufacturing costs.

Embodiments have been disclosed herein, and although specific terms are employed, they are used and are to be interpreted in a generic and descriptive sense only and not for the purpose of limitation. Accordingly, it will be understood by a person of ordinary skill in the art to which the invention pertains that various changes in forms and details may be made without departing from the spirit and scope of the present disclosure as set forth in the following claims.

What is claimed is:

1. A method of manufacturing a semiconductor device, the method comprising:

forming a first sacrificial layer including a nitride over a first source layer;

forming a second sacrificial layer including aluminum oxide over the first sacrificial layer;

forming a second source layer over the second sacrificial layer;

forming a stacked structure over the second source layer, the stacked structure including first material layers and second material layers that are alternately stacked;

forming a channel layer that passes through the stacked structure, the second source layer, the second sacrificial layer, and the first sacrificial layer, the channel layer being enclosed by a memory layer ;

forming a slit that passes through the stacked structure and the second source layer, the slit exposing the second sacrificial layer;

forming a polysilicon spacer in the slit;

forming an opening by removing the first sacrificial layer and the second sacrificial layer through the slit;

exposing the channel layer by etching the memory layer through the opening; and forming a third source layer that contacts the channel layer in the opening.

2. The method of claim 1, wherein the first material layers and the second material layers are protected by the polysilicon spacer when the first sacrificial layer and the second sacrificial layer are removed.

3. The method of claim 1, wherein the first material layers and the second material layers are protected by the polysilicon spacer when the memory layer is partially etched.

4. The method of claim 1, wherein forming the polysilicon spacer comprises:

forming a polysilicon material layer in the slit; and etching the polysilicon material layer and the second sacrificial layer to expose the first sacrificial layer.

5. The method of claim 1, wherein forming the polysilicon spacer comprises:

forming a polysilicon material layer in the slit; and etching the polysilicon material layer, the second sacrificial layer, and the first sacrificial layer to expose the first source layer.

6. The method of claim 1, wherein forming the third source layer comprises:

depositing a polysilicon layer in the opening and the silt; and forming the third source layer by etching the polysilicon layer in the slit by a wet etching process.

7. The method of claim 6, wherein a groove is formed at an upper surface of the first source layer when the polysilicon layer is etched by the wet etching process.

8. The method of claim 7, wherein the groove is located under the slit.

9. The method of claim 1, further comprising:

replacing the first material layers by third material layers through the slit; and forming an insulating layer in the slit.

10. The method of claim 1, wherein the first sacrificial layer has a greater thickness than that of the second sacrificial layer.

11. The method of claim 1, wherein the first source layer is formed over a metal source layer.

12. The method of claim 1, wherein each of the first, second, and third source layers includes polysilicon.

13. The method of claim 1, wherein the polysilicon spacer is a single layer.

14. The method of claim 1, wherein the slit has a first width at a first level corresponding to a lower surface of the stacked structure and a second width at a second level corresponding to an upper surface of the second source layer, the second width being greater than the first width.

15. A method of manufacturing a semiconductor device, the method comprising:
- forming a sacrificial structure that includes first, second, third, and fourth sacrificial layers;
- forming a stacked structure over the sacrificial structure, the stacked structure including first material layers and second material layers that are alternately stacked;
- forming a channel layer that passes through the stacked structure, and the sacrificial structure, the channel layer being enclosed by a memory layer;
- forming a slit that passes through the stacked structure and the fourth sacrificial layer, the slit exposing the third sacrificial layer;
- forming a polysilicon spacer in the slit;
- exposing the second sacrificial layer by etching the third sacrificial layer through the slit;
- forming an opening that exposes the memory layer by removing the second and third sacrificial layers through the slit;
- removing a part of the memory layer, the first sacrificial layer, and the fourth sacrificial layer to expose the channel layer; and
- forming a source layer that contacts the channel layer in the opening.

16. The method of claim 15, wherein the polysilicon spacer has high etch selectivity with respect to each of the second sacrificial layer, the third sacrificial layer, and the memory layer.

17. The method of claim 15, wherein the first sacrificial layer includes an oxide, the second sacrificial layer includes a nitride, the third sacrificial layer includes aluminum oxide, and the fourth sacrificial layer includes an oxide.

18. A method of manufacturing a semiconductor device, the method comprising:
- sequentially forming first, second, third, and fourth sacrificial layers over a first source layer to form a sacrificial structure;
- forming a second source layer over the sacrificial structure;
- forming a stacked structure over the second source layer, the stacked structure including first material layers and second material layers that are alternately stacked;
- forming a channel layer that passes through the stacked structure, the second source layer, and the sacrificial structure, and forming a memory layer that encloses the channel layer;
- forming a slit that passes through the stacked structure, the second source layer, and the fourth sacrificial layer and exposes the third sacrificial layer;
- forming a polysilicon spacer in the slit;
- exposing the first source layer by etching the first, second, and third sacrificial layers using the polysilicon spacer as a protective layer;
- forming an opening that exposes the memory layer by removing the second and third sacrificial layers using the polysilicon spacer as the protective layer;
- removing a part of the memory layer, the first sacrificial layer, and the fourth sacrificial layer to expose the channel layer; and
- forming a third source layer that contacts the channel layer in the opening.

19. The method of claim 18, wherein the polysilicon spacer has high etch selectivity with respect to each of the second sacrificial layer, the third sacrificial layer, and the memory layer.

20. The method of claim 18, wherein the first sacrificial layer includes an oxide, the second sacrificial layer includes a nitride, the third sacrificial layer includes aluminum oxide, and the fourth sacrificial layer includes an oxide.

* * * * *